United States Patent

Sadahisa et al.

[11] Patent Number: 5,766,492
[45] Date of Patent: Jun. 16, 1998

[54] METHOD OF METAL-PLATING ELECTRODE PORTIONS OF PRINTED-WIRING BOARD

[75] Inventors: Toshiya Sadahisa; Johji Nakamoto, both of Koka-gun; Kanji Nishijima, Ibaraki; Yoshinobu Kurosaki, Kobe, all of Japan

[73] Assignees: Nippon Paint Co., Ltd., Osaka-fu, Japan; International Business Machines Corporation, Armonk, N.Y.

[21] Appl. No.: 654,114

[22] Filed: May 28, 1996

[30] Foreign Application Priority Data

Jun. 5, 1995 [JP] Japan .................... 7-138250

[51] Int. Cl.$^6$ .................................................. B44C 1/22
[52] U.S. Cl. .................... 216/16; 216/41; 216/105; 216/106; 438/694; 438/703
[58] Field of Search .................... 216/16, 41, 105, 216/106; 438/694, 703

[56] References Cited

U.S. PATENT DOCUMENTS

| | | |
|---|---|---|
| 3,568,312 | 3/1971 | Perricone . |
| 5,209,817 | 5/1993 | Ahmad et al. ............ 216/41 |
| 5,620,612 | 4/1997 | Kukanskis et al. ............ 216/18 |

FOREIGN PATENT DOCUMENTS

| | | |
|---|---|---|
| 189975 | 8/1986 | European Pat. Off. . |
| 1554958 | 1/1969 | France . |
| 1536772 | 12/1978 | United Kingdom . |

OTHER PUBLICATIONS

Patent Abstracts of Japan, vol. 95, No. 5, Terada Hiroaki, 30 Jun. 1995, 21 Feb. 1995.

*Primary Examiner*—Mark Chapman
*Attorney, Agent, or Firm*—Wenderoth, Lind & Ponack, L.L.P.

[57] ABSTRACT

A method of metal-plating electrode portions of a printed-wiring board includes copper-plating the overall surface of the printed-wiring board on which an electric circuit has been formed, forming a metal plating resist coating on the copper plated wiring board except for on the electrode portions, and subjecting the electrode portions, which are not covered with the resist coating, to an electrolytic metal plating process, at least once, and then removing the remaining resist coating. The resist coating formation and the electrolytic metal plating process may optionally be repeated a predetermined number of times. An etching resist coating is then formed on the circuit portion including the electrode portions, and the copper-plated portion is then removed except from the circuit portion by etching and then stripping the etching resist coating.

15 Claims, 2 Drawing Sheets

Prior Art

METHOD OF METAL-PLATING ELECTRODE PORTIONS OF PRINTED-WIRING BOARD

FIELD OF THE INVENTION

The present invention relates to a method of metal-plating electrode portions of a printed-wiring board. More particularly, the present invention relates to a method of metal-plating electrode portions of a printed-wiring board wherein a thick metal plated layer is formed by electrolytic metal plating on electrode portions of a printed-wiring board so that reliability is significantly improved when mounting LSI chips or other chip elements by wire-bonding or solder bumping.

BACKGROUND OF THE INVENTION

Hitherto, a double-layered metal layer consisting of a nickel-plated undercoating layer and a gold-plated layer formed on the nickel-plated undercoating layer has been formed on electrode portions of a printed-wiring board in order to mount LSI chips or other chip elements by wire bonding. Also, when electric elements were to be mounted using a solder bump technique, a solder-plated layer was formed on the electrode portions.

A conventional method for plating the electrode portions of a printed-wiring board by employing electroless plating includes the steps as shown in FIG. 2.

FIG. 2 (a) shows an electric circuit 2 formed on a substrate 1. The circuit 2 is formed by conventional pattern etching using an etching resist of a copper-clad board or a copper-plated board. Although the substrate for use in the process generally has through holes, a substrate having no through holes may be employed. Then, as shown in FIG. 2 (b), a solder mask 7 is formed on a portion of a printed-wiring board, on which the circuit has been formed. The solder mask is not formed on an electrode portion 10. The solder mask 7 is formed by coating a photosensitive solder mask resin composition on the printed-wiring board, exposing it to light through a pattern mask in which the electrode portions are shielded from light, and then conducting development. As shown in FIG. 2(c), the electrode portions are then subjected to electroless metal plating to form a metal layer 8. The electroless metal plating is conducted by, for example, electroless-plating a nickel layer as undercoating and then electroless-plating a gold layer on the nickel layer, which is used for wire-bonding LSI chips. When electrical elements other than LSI chips are to be mounted on the printed wire board, a solder layer is formed on the electrode portions by electroless plating. The nickel electroless plating is generally conducted at a temperature of about 90° C. for about 40 minutes to form about 2μ thick nickel layer. The electroless gold plating is generally conducted at about 90° C. for about 10 minutes to form about 0.3μ thick gold layer. In case of electroless solder plating, a solder layer, about 10μ thick, is formed at about 70° C. for about 20 minutes.

Where both electroless nickel plating and electroless gold plating are conducted in the conventional plating method as shown in FIG. 2, the thickness of the gold plated layer is limited to 0.5μ at most. In view of the reliability of wire boding process, a desirable thickness of the gold layer is about 1μ which, however, is difficult to form using the conventional method. The electroless plating, as mentioned above, has to be conducted at a high temperature and for a long period of time. The solder mask resist, on the portion of the board other than the electrode portions, suffers chemical attack from the plating solution because the solder mask does not have sufficient chemical resistance or adhesiveness to the board. In case of the electroless solder plating, the solder layer is generally limited to about a 15μ thickness, at most, which is not sufficient for use in soldering because the solder layer is generally required to have a thickness of about 30μ. The chemical reactions of electroless solder plating take place by a substitution reaction of tin and lead ions in the plating solution with copper ions eluted from the copper circuit. The solder layer plated on the copper covers the copper surface of the electrode portion of the printed-wiring board and, therefore, inhibits elution of copper into the plating solution to stop the substitution reaction. This means that the underlying copper circuit is dissolved by a thickness similar to that of the plated solder. Therefore, the thickness of the underlying copper is required to be thick enough to compensate for the thickness reduction. The thickness reduction of copper in the through holes deteriorates the reliability of the electrical connection. Thus, a strategy for compensating for the thickness reduction of the copper is necessary. Although it might be considered feasible to form a thick copper layer followed by etching or the like to form the circuit, a fine pattern is not generally obtained and the problem of not being able to obtain a high-density printed-wiring board arises.

Before the above mentioned electroless plating method was employed, i.e., before such high density wiring was required, a circuit for conducting metal plating on only the electrode portions of the printed wiring board by electrolysis had been formed simultaneously with the general circuit, and the circuit for metal plating had been used to form a thick metal layer on the electrode portions of the printed-wiring board. The circuit for plating was cut before elements were mounted on the board. However, the presence of the circuit only for electrolytic plating, which was not the object circuit, limited the freedom in designing the overall circuit and was one factor that inhibited the formation of a high-density wiring board. In order to solve the problem, the electroless metal plating method as shown in FIG. 2 has been employed. By using the electroless metal plating method, the freedom in designing a high-density printed-wiring board has been improved and has been mainly used as the conventional technique.

Although the electrolytic plating employed before the electroless metal plating method has been studied again, the method, which had been actually conducted, is not adaptable to the present technique which requires a very high wiring density.

SUMMARY OF THE INVENTION

In order to eliminate the above mentioned problem, the present inventors have invented the following useful method. The present invention provides a method of metal-plating electrode portions of a printed-wiring board by copper-plating the overall surface of the printed-wiring board on which an electric circuit has been formed, forming a metal plating resist coating on the copper plated wiring board except for on the electrode portions, and subjecting the electrode portions, which are not covered with the resist coating, to an electrolytic metal plating process, at least once, and then removing the remaining resist coating. The resist coating formation and the electrolytic metal plating process may optionally be repeated a predetermined number of times. A etching resist coating is then formed on the circuit portion including the electrode portions, and the copper-plated portion is then removed except from the circuit portion by etching and then stripping the etching resist coating.

DETAILED DESCRIPTION OF THE INVENTION

Figure 1:
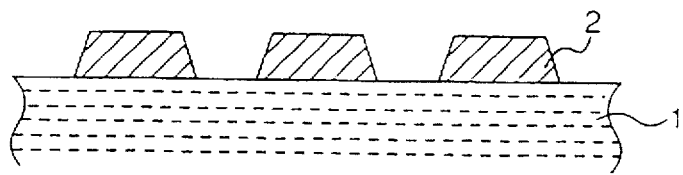
FIGS. 1(a) to 1(f) sequentially illustrate the method of metal-plating the electrode portions of the printed-wiring board according to the present invention.
Figure 1:
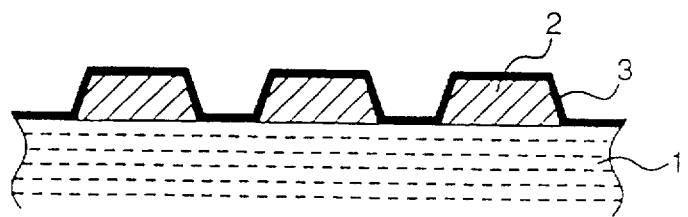
Figure 1:
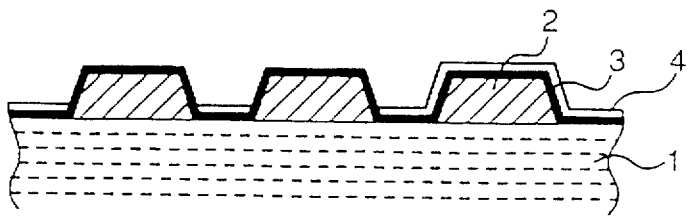
Figure 1:
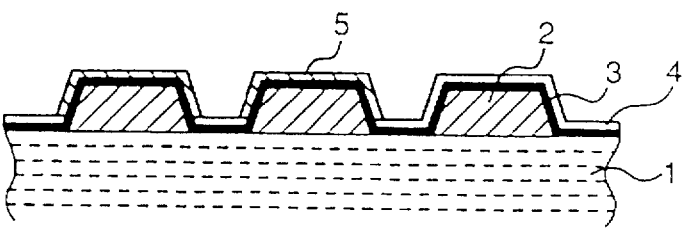
Figure 1:
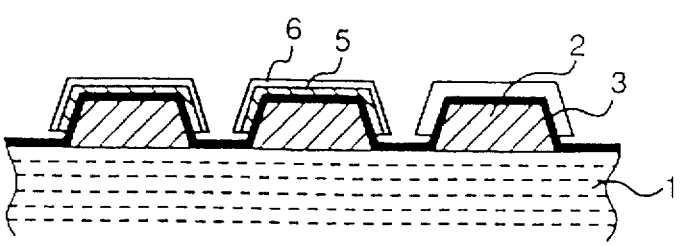
Figure 1:
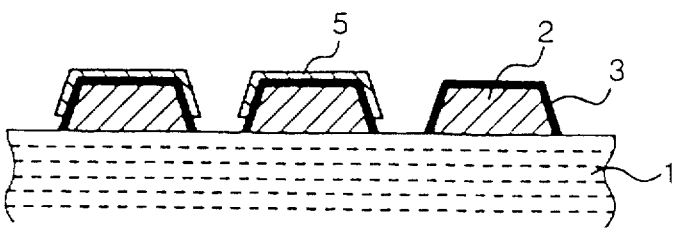

An embodiment of the present invention will now be described with reference to FIGS. 1(a) to 1(f).

As shown in FIG. 1(a), a circuit 2 is formed on a substrate 1 by known pattern etching using an etching resist of a copper-clad substrate or a copper-plated substrate. Although the substrate for use in the foregoing process generally has through holes, a substrate having no through holes may be employed.

As shown in FIG. 1(b), the overall surface of the substrate, including the circuit portion, is subjected to copper plating to form a copper layer 3. The thickness of the copper layer may be in a range from 1 to 10μ, preferably 2 to 5μ. If the thickness of the copper-plated layer is smaller than 1μ, an effect of performing copper plating cannot be obtained. If it exceeds 10μ, a high density of the circuit is not obtained. The copper plating is conducted by activating an art-known catalyst and then electroless copper plating. If necessary, the surface of the electroless copper-plated layer may be again subjected to electrolytic copper plating to form an electrolytic-plated copper layer thereon.

Then, as shown in FIG. 1(c), a metal plating resist coating 4 is formed on the board except for on the electrode portions, i.e., the metal plating resist coating 4 is not formed on electrode portions of the circuit but is formed elsewhere on the board, including over the through holes if present. The metal plating resist coating is formed from a negative or positive photosensitive resin composition or a conventional screen-type ink composition. In the case of the present invention having an object of forming a high-density printed-wiring board having through holes, it is preferable that a positive photosensitive resin composition is employed. Since the plating resist photosensitive resin composition is formed on the copper-plated layer 3, it can easily be coated if the composition is electrodepositable. In particular, an electrodepositable positive photosensitive resin composition, for example, Photo EDP-2000 (manufactured by Nippon Paint Co., Ltd.), is preferably employed. The electrodeposition conditions may be varied, but for example, it is performed for 1 to 3 minutes at an applied voltage of 100 to 250 V. In general, a photosensitive resin film having a thickness of 5 to 10μ is formed on the copper-plated surface of the substrate. Then, exposure is performed by using a pattern mask which shields portions of the substrate, except for the electrode portions. The exposed electrode portions are developed with a developer to remove the resist from the electrode portions and to thereby form a desired metal plating resist coating 4.

Then, as shown in FIG. 1(d), the electrode portions having a bare surface are subjected to electrolytic metal plating to form a metal plated coating 5 on the electrode portions. The electrolytic metal plating is conducted by forming a nickel undercoating having 3 to 10μ and then forming thereon a gold coating having 0.3 to 1.5μ for wire bonding LSI chips. When chip elements other than LSI chips are to be mounted, electrolytic solder plating is conducted to form a solder layer having 15 to 30μ on the electrode portions, instead of soldering with a solder stick. Also, as shown in FIG. 1(d), the nickel and gold plating is conducted and then the solder plating is conducted, provided that the portions to be solder plated are not yet bared when conducting the first nickel and gold plating. After finishing the first nickel and gold plating, the portions to be solder plated are let bare using an exposure and development method of a photosensitive resin composition. If such process is repeated, different kinds of metal layers can be formed on the electrode portions on the printed wiring board.

In the present invention, the nickel plating can be conducted in a nickel plating solution, for example, a solution containing nickel sulfamate. It may be conducted at 2 A/dm² for 8 minutes at a temperature of the plating solution of 55° C. to form a nickel layer having about 3μ. The gold plating may be conducted in a weak acidic gold plating solution containing gold potassium cyanide of 55° C. at 1 A/dm² for 5 minutes to form a gold layer having about 1μ. The solder plating may be conducted in a solder plating solution containing tin borofluoride and lead borofluoride of 24° C. at 2 A/dm² for 25 minutes to form a solder layer having about 30μ. Other electrolytic plating metals, such as palladium, tin and so on can be used.

As shown in FIG. 1 (e), an etching resist coating 6 is formed on a portion of the circuit including the electrode portions. The etching resist coating is formed from a negative type or positive type photosensitive resin composition or a general screen-type ink composition. When it is an object to employ the present invention to form a high-density printed-wiring board having through holes, a photosensitive resin composition, especially an electrodepositable positive photosensitive resin composition, is preferably employed. In the present invention, Photo EDP-2000 (manufactured by Nippon Paint Co., Ltd.) is employed in desirable electrodeposition conditions to form a photosensitive resin layer having a thickness of about 7μ on the surface of the substrate including the electrode portions. Then, exposure is performed by using a pattern mask, the circuit portion of which is shielded from light. The exposed portion except the circuit portions is developed with a developer to form an etching resist coating.

As shown in FIG. 1(f), cupric chloride, which is a general acid etching solution, is used to remove, by an etching process, the copper-plated portion from the substrate except from the portions which make up the circuit portions. The remaining resist coating is removed by a sodium hydroxide stripping solution so that a circuit, including an electrolytic metal plated layer, is formed.

According to the present invention, a thick electrolytic plated metal layer is formed on the electrode portions of the printed-wiring board, whereby reliability is improved when an LSI chip or another chip element is mounted while being electrically connected by wire bonding or solder bumps. Since the solder mask is formed after plating has been performed, deterioration in quality, which occurs during plating, can be prevented.

Figure 2:
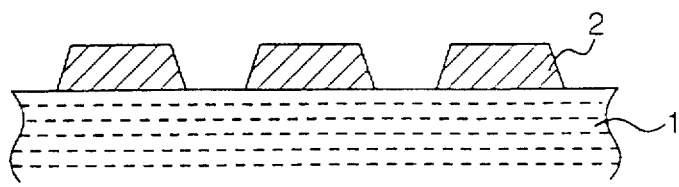
FIGS. 2(a) to 2(c) sequentially illustrate a conventional process of metal-plating the electrode portion of a wiring board by electroless metal plating.
Figure 2:
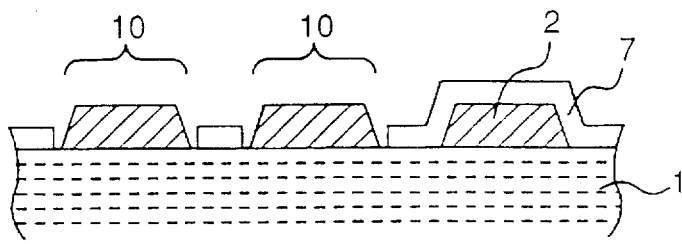
Figure 2:
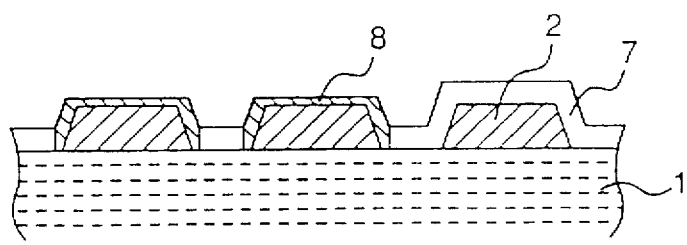

With the method according to the present invention, although the number of manufacturing processes increases as compared with the conventional technique shown in FIG. 2, the reliability can be improved when an LSI chip or the like is mounted.

What is claimed is:

1. A method of metal-plating electrode portions of a printed wiring board, said method comprising:

forming an electric circuit on the printed wiring board, said electric circuit having electrode portions;

copper-plating an overall surface of the printed wiring board including said electric circuit so as to form a copper layer;

forming a metal plating resist coating over a surface of the printed wiring board including said electric circuit, except for on said electrode portions;

subjecting, at least one time, said electrode portions of said electric circuit to an electrolytic metal plating process to form a metal plated layer only over said electrode portions of said electric circuit;

removing said metal plating resist coating;

forming an etching resist coating on said electric circuit, including said electrode portions; and removing by etching said copper layer from said overall surface of the printed wiring board, except from on said electric circuit; and removing said etching resist coating.

2. A method of metal-plating electrode portions of a printed wiring board as claimed in claim 1, wherein the printed wiring board has through-holes and said metal plated layer is not formed over the through-holes of the printed wiring board.

3. A method of metal-plating electrode portions of a printed wiring board as claimed in claim 1, further comprising:

repeating the forming of a metal plating resist coating, the subjecting to an electrolytic metal plating process and the removing of the metal plating resist coating a predetermined number of times.

4. A method of metal-plating electrode portions of a printed wiring board as claimed in claim 1, wherein said metal plating resist coating is formed from a positive type or a negative type photosensitive resin composition.

5. A method of metal-plating electrode portions of a printed wiring board as claimed in claim 1, wherein said metal plating resist coating is formed from an electrodepositable positive type photosensitive resin composition.

6. A method of metal-plating electrode portions of a printed wiring board as claimed in claim 1, wherein said metal plated layer includes a nickel undercoating layer having a thickness of 3 to 10μ and a gold-plated layer having a thickness of 0.3 to 1.5μ formed on said nickel undercoating layer.

7. A method of metal-plating electrode portions of a printed wiring board as claimed in claim 1, wherein said metal plated layer is solder plating.

8. A method of metal-plating electrode portions of a printed wiring board as claimed in claim 1, wherein said copper layer has a thickness of 1 to 10μ.

9. A method of metal-plating electrode portions of a printed wiring board having through-holes, said method comprising:

forming an electric circuit on the printed wiring board, said electric circuit having electrode portions;

copper-plating an overall surface of the printed wiring board including said electric circuit so as to form a copper layer;

forming a metal plating resist coating over a surface of the printed wiring board including said electric circuit, other than on said electrode portions;

subjecting, at least one time, said electrode portions of said electric circuit to an electrolytic metal plating process to form a metal plated layer over said electrode portions of said electric circuit, wherein said metal plated layer is not formed over the through-holes of the printed wiring board;

removing said metal plating resist coating;

forming an etching resist coating on said electric circuit, including said electrode portions; and removing by etching said copper layer from said overall surface of the printed wiring board, except from on said electric circuit; and removing said etching resist coating.

10. A method of metal-plating electrode portions of a printed wiring board having through-holes as claimed in claim 9, further comprising:

repeating the forming of a metal plating resist coating, the subjecting to an electrolytic metal plating process and the removing of the metal plating resist coating a predetermined number of times.

11. A method of metal-plating electrode portions of a printed wiring board having through-holes as claimed in claim 9, wherein said metal plating resist coating is formed from a positive type or a negative type photosensitive resin composition.

12. A method of metal-plating electrode portions of a printed wiring board having through-holes as claimed in claim 9, wherein said metal plating resist coating is formed from an electrodepositable positive type photosensitive resin composition.

13. A method of metal-plating electrode portions of a printed wiring board having through-holes as claimed in claim 9, wherein said metal plated layer includes a nickel undercoating layer having a thickness of 3 to 10μ and a gold-plated layer having a thickness of 0.3 to 1.5μ formed on said nickel undercoating layer.

14. A method of metal-plating electrode portions of a printed wiring board having through-holes as claimed in claim 9, wherein said metal plated layer is solder plating.

15. A method of metal-plating electrode portions of a printed wiring board having through-holes as claimed in claim 9, wherein said copper layer has a thickness of 1 to 10μ.

* * * * *